(12) United States Patent
Wu

(10) Patent No.: US 6,274,428 B1
(45) Date of Patent: Aug. 14, 2001

(54) METHOD FOR FORMING A RAGGED POLYSILICON CROWN-SHAPED CAPACITOR FOR A MEMORY CELL

(75) Inventor: Shye-Lin Wu, Hsinchu (TW)

(73) Assignee: Acer Semiconductor Manufacturing Inc., Hsinchu (TW)

( * ) Notice: Subject to any disclaimer, the term of this patent is extended or adjusted under 35 U.S.C. 154(b) by 0 days.

(21) Appl. No.: 09/310,487

(22) Filed: May 12, 1999

Related U.S. Application Data

(63) Continuation-in-part of application No. 09/298,927, filed on Apr. 22, 1999.

(51) Int. Cl.$^7$ ............................................. H01L 21/8242
(52) U.S. Cl. ............................................. 438/255; 438/398
(58) Field of Search ................................... 438/255, 258, 438/260, 396, 398, 745, 756, 757

(56) References Cited

U.S. PATENT DOCUMENTS

| | | | |
|---|---|---|---|
| 5,597,756 | * | 1/1997 | Fazan et al. ............................ 437/52 |
| 6,037,234 | * | 3/2000 | Hong et al. ........................... 438/396 |
| 6,057,205 | * | 5/2000 | Wu ...................................... 438/398 |

* cited by examiner

Primary Examiner—David Nelms
Assistant Examiner—Quoc Hoang

(57) ABSTRACT

In the preferred embodiment for forming a ragged polysilicon crown-shaped capacitor of a memory cell, a first dielectric layer is formed on a semiconductor substrate. A portion of the first dielectric layer is removed to define a contact hole within the first dielectric layer, wherein the contact hole is extended down to a source region in the substrate. Next, a conductive plug is formed and communicated to the source region within the contact hole. A second dielectric layer is formed on the first dielectric layer and the conductive plug, and a third dielectric layer is formed on the second dielectric layer. Next, portions of the third dielectric layer and the second dielectric layer are removed to define a storage node opening, wherein the storage node opening is located over the conductive plug. A first conductive layer is then formed to conformably cover the inside surface of the storage node opening and on the third dielectric layer. A fourth dielectric layer is formed on the first conductive layer, and the substrate is planarized to the surface of the third dielectric layer. The fourth dielectric layer and the third dielectric layer are then removed to leave a storage node which is composed of the first conductive layer. A hemispherical grained silicon layer is then formed on the storage node and the second dielectric layer. A thermal oxidization process is carried out to the substrate to oxidize the hemispherical grained silicon layer and portions of the storage node exposed through grains of the hemispherical grained silicon layer. The oxidized parts of the storage node and the hemispherical grained silicon layer are then removed. Finally, a fifth dielectric layer is formed on the storage node, and a second conductive layer is then formed on the fifth dielectric layer to finish the capacitor structure.

11 Claims, 7 Drawing Sheets

METHOD FOR FORMING A RAGGED POLYSILICON CROWN-SHAPED CAPACITOR FOR A MEMORY CELL

CROSS REFERENCE TO RELATED APPLICATIONS

This invention is a continuation-in-part application of Ser. No. 09/298,927 filed Apr. 22, 1989 under the title of "METHOD FOR FORMING A DRAM CELL WITH A RAGGED POLYSILICON CROWN-SHAPED CAPACITOR" filed at Apr. 23, 1999, which is assigned to same assignee with the same inventor as the present application.

BACKGROUND OF THE INVENTION

1. Field of the Invention

The present invention relates to the fabrication of a capacitor, and more particularly, to a method for forming a ragged polysilicon crown-shaped capacitor of a memory cell, such as a dynamic random access memory (DRAM) cell.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flows into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

SUMMARY OF THE INVENTION

In accordance with the present invention, a method is provided for forming a ragged polysilicon crown-shaped capacitor, which substantially increases the surface area of the capacitor, for the construction of a memory cell, especially for a dynamic random access memory (DRAM) cell. In the preferred embodiment, a first dielectric layer is formed on a semiconductor substrate. A portion of the first dielectric layer is removed to define a contact hole within the first dielectric layer, wherein the contact hole is extended down to a source region in the substrate. Next, a conductive plug is formed to be communicated to the source region within the contact hole. A second dielectric layer is formed on the first dielectric layer and the conductive plug, and a third dielectric layer is formed on the second dielectric layer.

Next, portions of the third dielectric layer and the second dielectric layer are removed to define a storage node opening within the third dielectric layer and the second dielectric layer, wherein the storage node opening is located over the conductive plug. A first conductive layer is then formed to conformably cover the inside surface of the storage node opening and on the third dielectric layer. A fourth dielectric layer is formed on the first conductive layer, and the substrate is planarized to the surface of the third dielectric layer. The fourth dielectric layer and the third dielectric layer are then removed to leave a storage node which is composed of the first conductive layer. A hemispherical grained silicon layer is then formed on the storage node and the second dielectric layer. A thermal oxidization process is carried out to the substrate to oxidize the hemispherical grained silicon layer and portions of the storage node exposed through grains of the hemispherical grained silicon layer. The oxidized parts of the storage node and the hemispherical grained silicon layer are then removed. Finally, a fifth dielectric layer is formed on the storage node, and a second conductive layer is then formed on the fifth dielectric layer to finish the capacitor structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
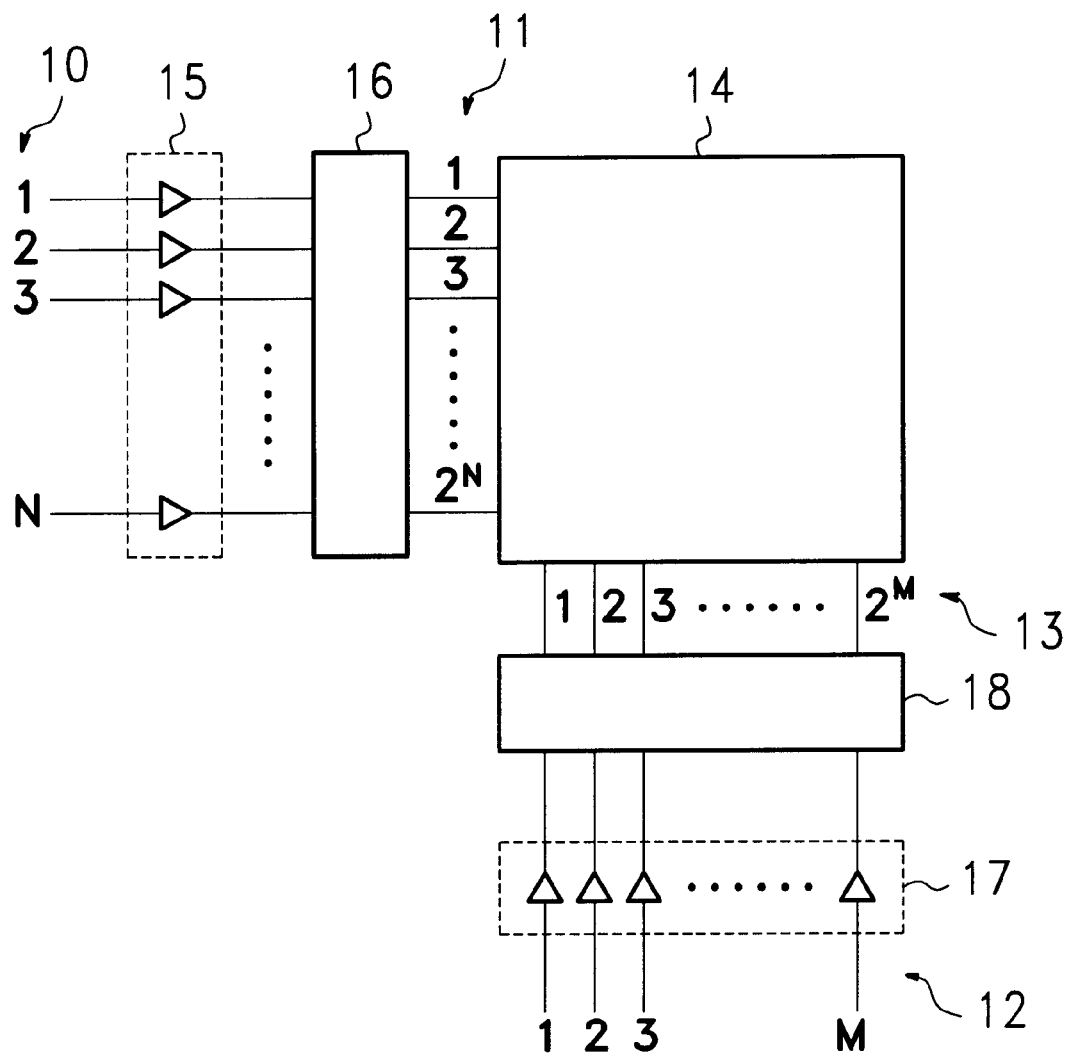
FIG. 1 shows a simplified diagram illustrative of the organization of a typical large semiconductor memory.
Figure 2A:
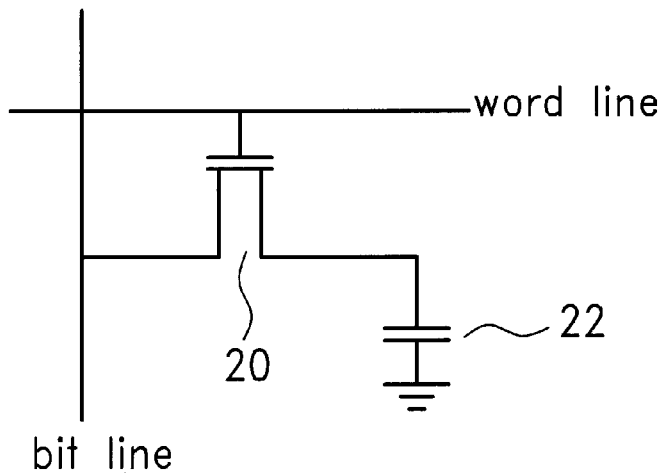
FIG. 2A shows a circuit schematic diagram of a typical one-transistor dynamic random access memory (DRAM) cell.
Figure 2B:
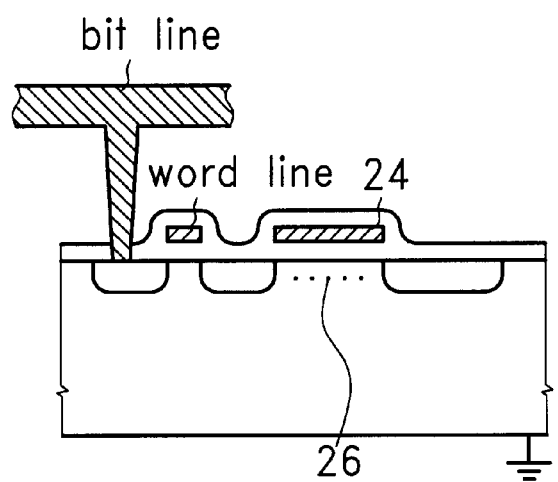
FIG. 2B shows a cross-sectional view illustrative of traditional one-transistor DRAM storage cell.
Figure 3:
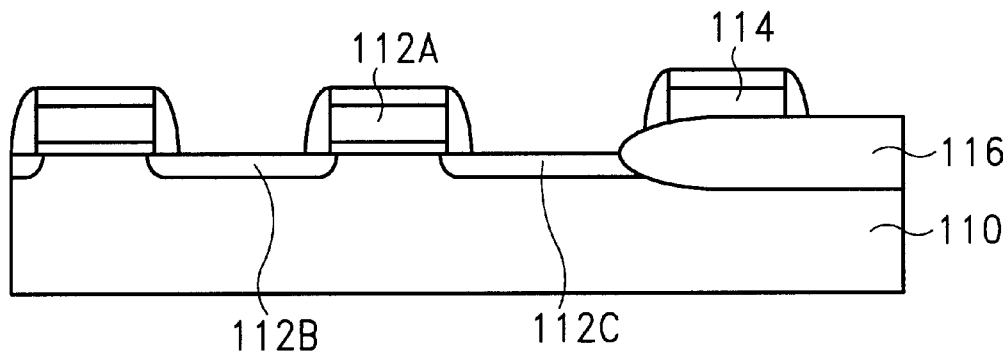
FIG. 3 shows a cross-sectional view illustrative of a semiconductor substrate having transistors thereon for forming DRAM capacitors in accordance with the present invention.

Referring to FIG. 3, a metal-oxide-semiconductor field effect transistor (MOSFET) having a gate 112A, a drain 112B and a source 112C, is conventionally formed in and on the substrate 110. A field oxide (FOX) region 116 is conventionally formed in the substrate 110 adjacent to the MOSFET for isolation purposes. Further, a word line 114 is formed on the FOX region 116. In this embodiment, the MOSFET is an n-channel MOSFET that forms part of a DRAM cell.

Figure 4:
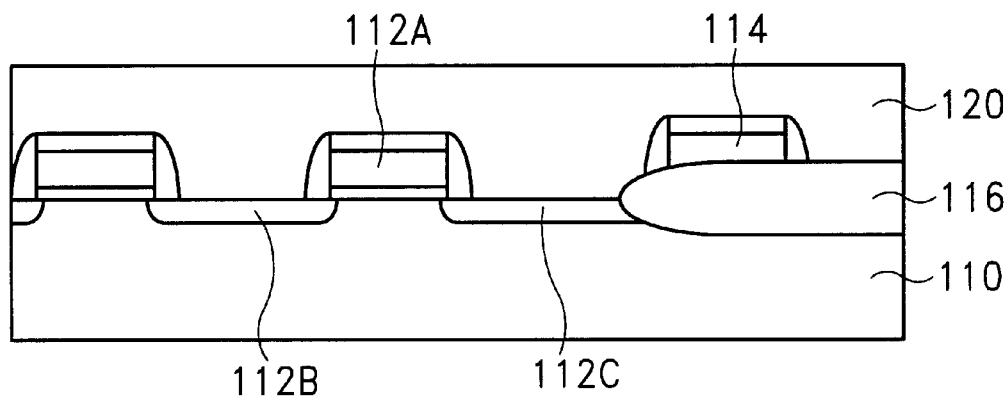
FIG. 4 shows a cross-sectional view illustrative of forming a first dielectric layer on the semiconductor substrate in accordance with the present invention.

Next, a first dielectric layer 120, such as an undoped oxide layer, a doped silicon oxide layer or a boro-phosphosilicate glass (BPSG) layer, is deposited over the substrate 110 and the structure of FIG. 3, in order to serve as the main insulation layer between conductive layers or conductive regions. The first dielectric layer 120 is typically deposited with a conventional low pressure chemical vapor deposition (LPCVD) or plasma enhanced chemical vapor deposition (PECVD) process as shown in FIG. 4. The thickness of this silicon oxide layer 120 can be ranged from about 3000 to 6000 angstroms. After the silicon oxide layer 120 is deposited, it can then be planarized using any suitable conventional method such as an etch back process or a chemical mechanical polishing (CMP) process.

Figure 5:
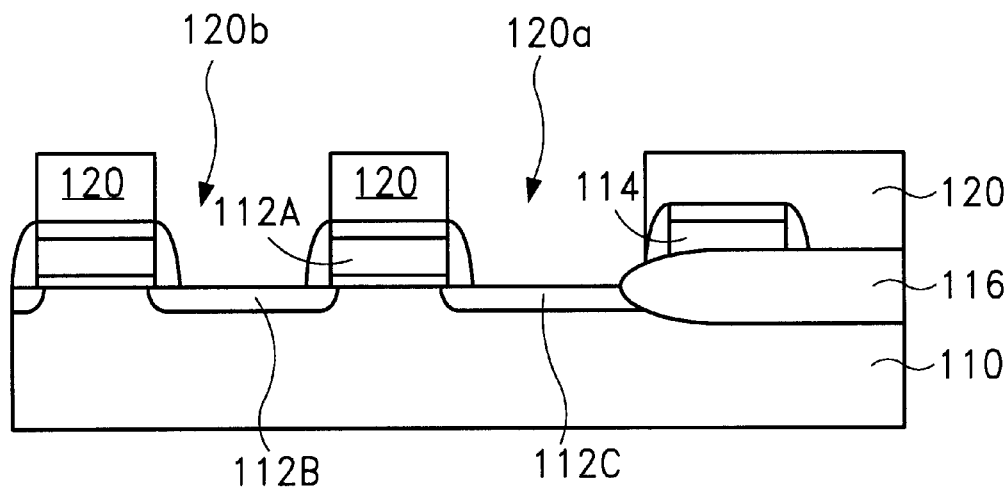
FIG. 5 shows a cross-sectional view illustrative of removing a portion of the first dielectric layer to define a contact hole in accordance with the present invention.

Referring to FIG. 5, a process of removing a portion of the first dielectric layer 120 is performed to define a contact hole 120a within the first dielectric layer 120, and make the contact hole 120 be extended down to a source region 112c in the substrate 110. A typical process including lithography and etching approach is employed to define the contact hole 120a. In the preferred embodinents, a bit line contact hole 120b is defined simultaneously with the contact hole 120a for a storage node.

Figure 6:
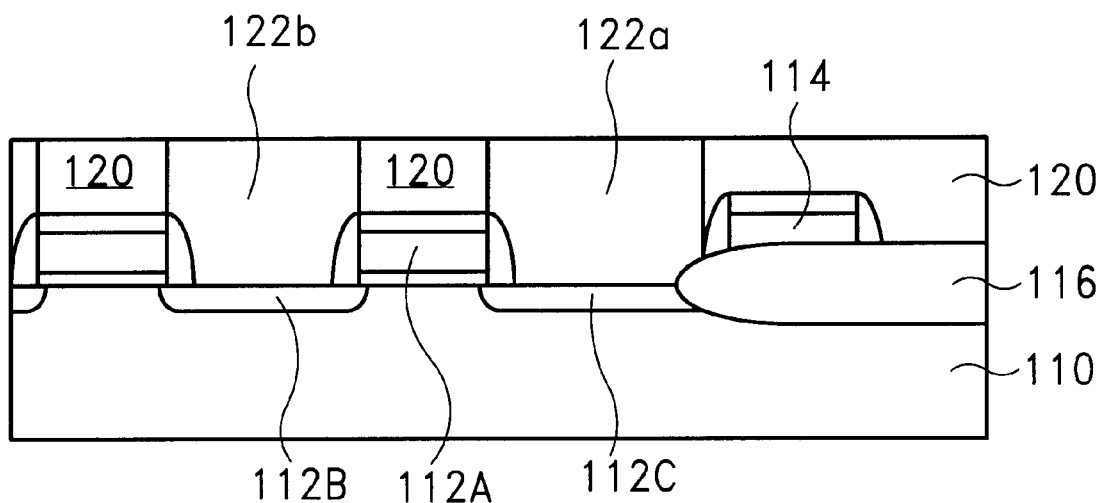
FIG. 6 shows a cross-sectional view illustrative of forming a conductive plug within the contact hole in accordance with the present invention.

Turning to FIG. 6, a conductive plug 122a is formed and also communicated to the source region 112c within the contact hole 120a. The conductive plug 122a is preferably a polysilicon plug, which is formed by depositing and etching-back a polysilicon layer. Another conductive plug 122b is formed within the bit line contact hole 120b at the same time.

Figure 7:
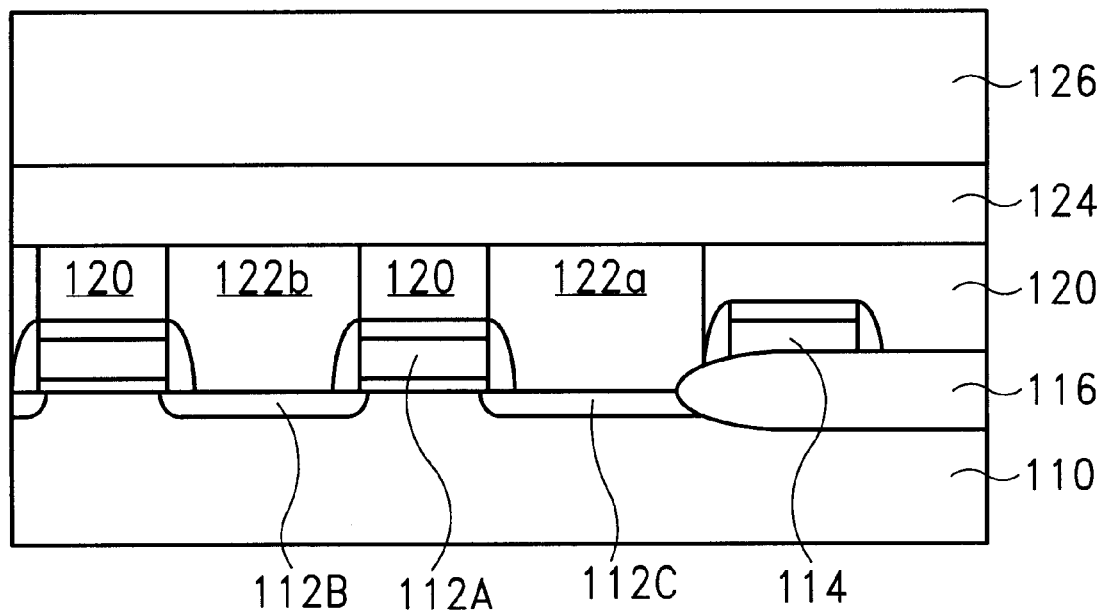
FIG. 7 shows a cross-sectional view illustrative of forming a second dielectric layer and a third dielectric layer in accordance with the present invention.

Referring to FIG. 7, a second dielectric layer 124 is then formed on the first dielectric layer 120 and the conductive plugs 122a and 122b. In the preferred embodiments, a silicon nitride layer is employed as the second dielectric layer 124. This silicon nitride layer 124 is deposited using a conventional low pressure chemical vapor deposition (LPCVD) or plasma enhanced chemical vapor deposition (PECVD). The thickness of the silicon nitride layer 124 is between about 1000 to 3000 angstroms in the case.

Further, a third dielectric layer 126 of silicon oxide is subsequently formed on the second dielectric layer 124. In this embodiment, this silicon oxide layer 126 is deposited using a conventional low pressure chemical vapor deposition (LPCVD) or plasma enhanced chemical vapor deposition (PECVD). The thickness of the silicon oxide layer 126 is about 5000 to 10000 angstroms, in order to provide a recessed space for forming storage node therein.

Figure 8:
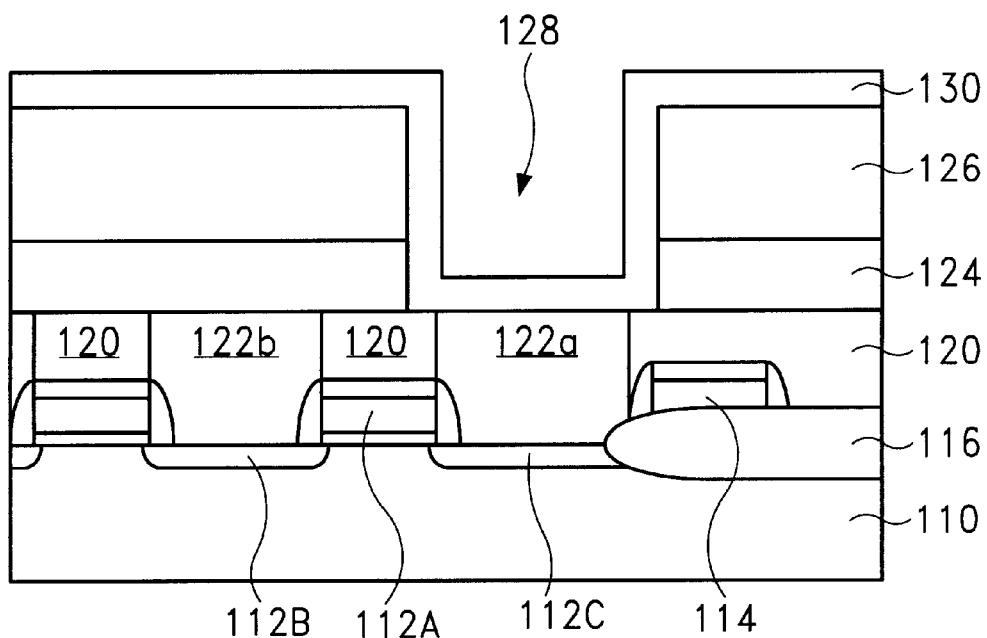
FIG. 8 shows a cross-sectional view illustrative of removing portions of the third dielectric layer and the second dielectric layer to define a storage node opening, and forming a first conductive layer therein, in accordance with the present invention.

Next, a series of steps are carried out to remove portions of the third dielectric layer 126 and the second dielectric layer 124 to define a storage node opening 128, within the third dielectric layer 126 and the second dielectric layer 124, as shown in FIG. 8. For communicating the bottom electrode of the capacitor, the storage node opening 128 is located over the conductive plug 122a. The steps for forming the storage node opening 128 typically includes the lithography process and a following etch step.

A first conductive layer 130 is formed to conformably cover on the surfaces inside the storage node opening 128 and also cover on the third dielectric layer 126. In the preferred embodiments, the first conductive layer 130 is a doped polysilicon layer, for example, using a standard chemical vapor deposition process with in-situ doped n-type dopants, in order to serve as the bottom electrode of the capacitor. In the preferred embodiments, the thickness of the first conductive layer 130 is between about 500 to 3000 angstroms.

Figure 9:
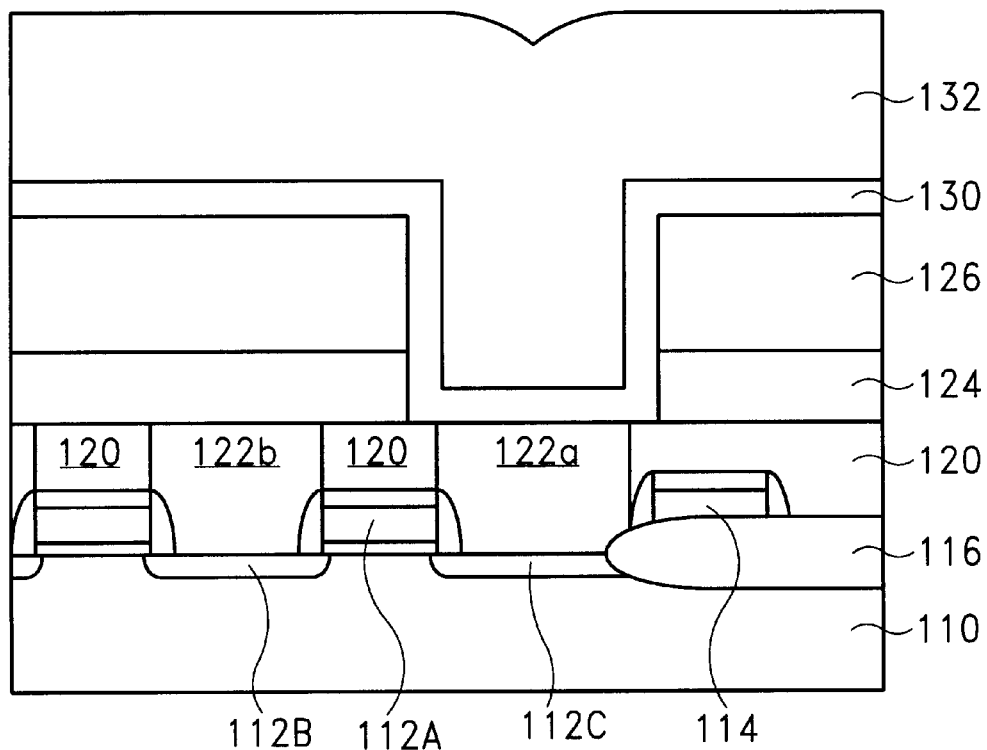
FIG. 9 shows a cross-sectional view illustrative of forming a fourth dielectric layer on the substrate in accordance with the present invention.

Referring to FIG. 9, a fourth dielectric layer 132 is then deposited on the the first conductive layer 130. In the case, a thick silicon oxide layer is formed as the fourth dielectric layer 132, in a manner of totally filling up the space inside the recessed region within the first conductive layer 130. As an example, the thickness of the fourth dielectric layer 132 is about 4000 to 9000 angstroms. In addition to silicon oxide, other alternative materials, such as silicon nitride or photoresist, can also be utilized as the fourth dielectric layer 132 to form over the first conductive layer 130.

Figure 10:
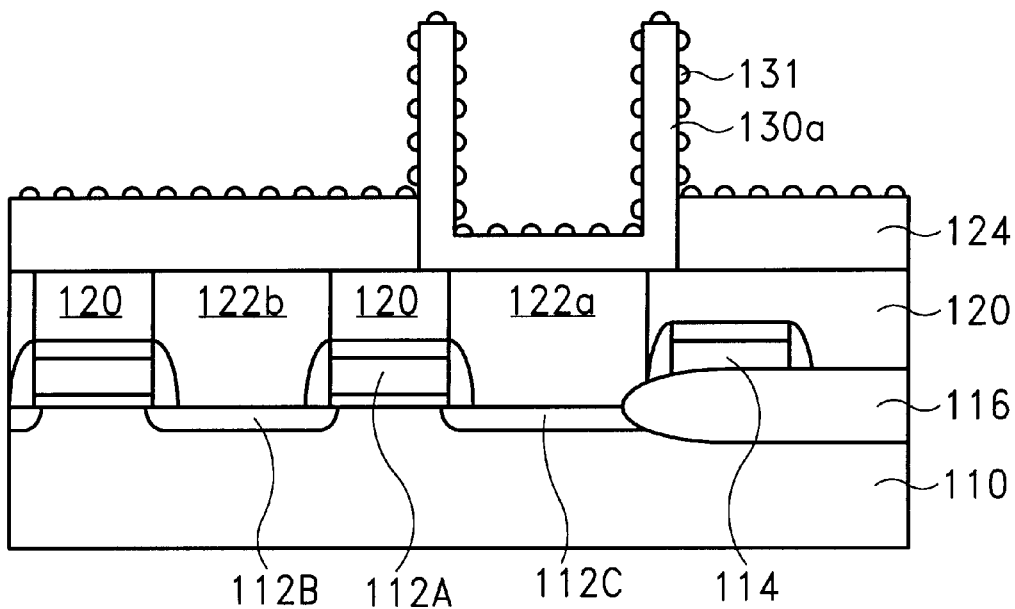
FIG. 10 shows a cross-sectional view illustrative of planarizing the substrate, removing the fourth and the third dielectric layer to leave a storage node, and forming a hemispherical grain layer in accordance with the present invention.

A planarizing step is performed to the substrate 110, preferably performed down to the surface of the third dielectric layer 126 for removing portions of the first conductive layer 130 and defining individual bottom electrodes, as shown in FIG. 10. As an example, a chemical-mechanical polish (CMP) process is utilized for planarizing the top surface of the substrate 110.

The fourth dielectric layer 132 and the third dielectric layer 126 remained after the planarizing step are then removed to leave a storage node 130a, which is composed of the first conductive layer 130. Having the fourth dielectric layer 132 and the third dielectric layer 126 of silicon oxide in the case, a wet etch using diluted hydrofluoric acid or buffered oxide etchant (BOE) is carried out to remove silicon oxide. If silicon nitride or photoresist are employed alternatively as the fourth dielectric layer 132, an appropriate removing step can be performed prior to the application of the wet etch to the third dielectric layer of silicon oxide, in order to remove the fourth dielectric layer 132 contained within the recessed region of the first conductive layer 130 after the planarization process.

A hemispherical grained (HSG) silicon layer 131 is then deposited on the storage node 130a. The hemispherical grained silicon layer 131, which is preferably an undoped silicon layer, is deposited to have a thickness of about 200 to 1000 angstroms and grain size ranging from about 200 to 1000 angstroms in the case.

In the preferred embodiments of forming hemispherical grained silicon layer 131, a seed layer may be needed for the formation of grained silicon. A thin titanium nitride (TiN) layer can be conformably formed on the storage node 130a with suitable processes. In this embodiment, a low pressure chemical vapor deposition (LPCVD) is preferably used to achieve excellent conformity and thickness controllability. The TiN layer is preferably deposited to a thickness between about 100 to 300 angstroms, while the thickness can range from about 50 to 1000 angstroms in different cases.

Having the TiN layer as a seed layer, the nucleation sites in forming the HSG silicon layer 131 are provided. In the case without employing the TiN layer, silicon particles on the surface of the storage node 130a can also be employed as the nucleation sites in the conventional techniques for forming the HSG layer 131. During forming the HSG silicon layer 131 in accordance with the embodiment of the present invention, deposited HSG polysilicon nucleates on the surface of the seed layer, or in the gas phase, to form a great number of polysilicon nodules over the surface of the first conductive layer 130. While the polysilicon deposition is continued further, these nodules grow to become grains as shown in FIG. 10. It is noted that a low temperature of about 250° C. to 350° C. is sufficient to form the HSG silicon layer 131, for example, using plasma enhanced chemical vapor deposition (PECVD) in the preferred embodiment. A higher temperature of about 500–650° C. may be necessary in forming HSG silicon using the conventional technique, such as low pressure chemical vapor deposition (LPCVD).

Figure 11:
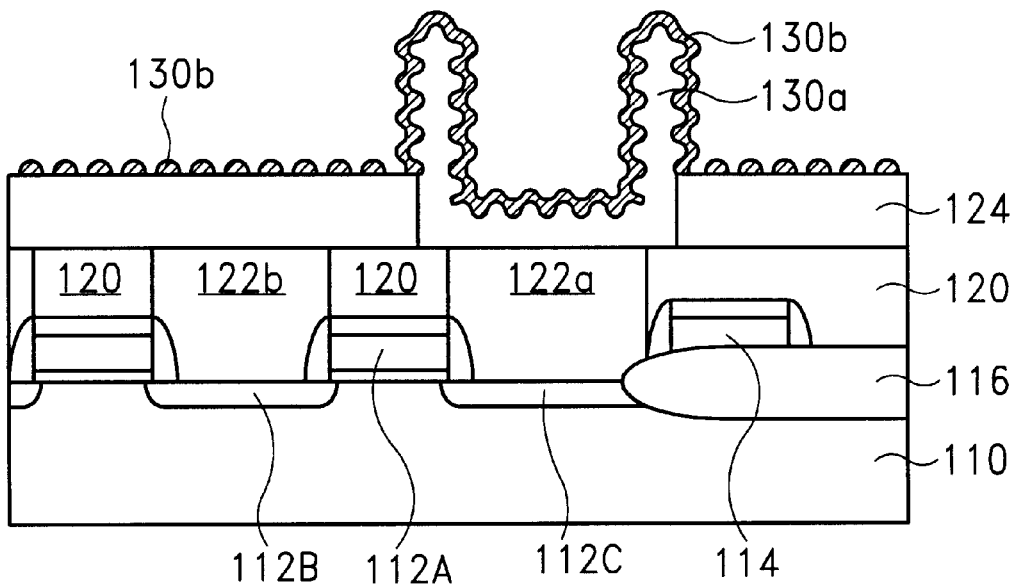
FIG. 11 shows a cross-sectional view illustrative of oxidizing the hemispherical grained silicon layer and portions of the storage node exposed through grains of the hemispherical grained silicon layer, in accordance with the present invention.
Figure 12:
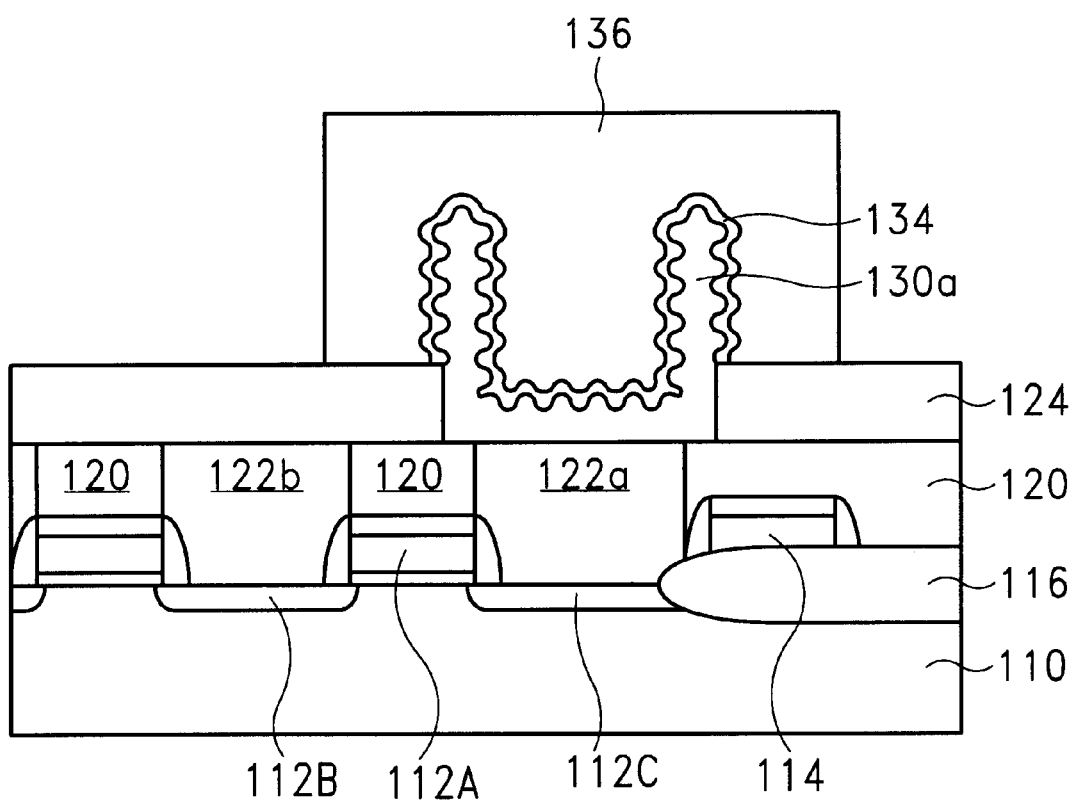
FIG. 12 shows a cross-sectional view illustrative of forming a fifth dielectric layer and a second conductive layer to form a capacitor in accordance with the present invention.

Turning to FIG. 11, a thermal oxidization process is carried out to the substrate 110 and overlying structures, in order to oxidize the hemispherical grained silicon layer 131 and portions of the storage node 130a exposed through grains of the hemispherical grained silicon layer, such the exposed region depicted in FIG. 10 between grains. In the preferred embodiments, nearly all the grains of the hemispherical grained silicon layer 131 are oxidized. Since the oxidization rate of the doped silicon in the first conductive layer 130 is greater than the that of the undoped silicon in the hemispherical grained silicon layer 131, the exposed region of the storage node 130a are oxidized further in depth, and the flat surface of the storage node 130a is encroach by the consumption of silicon to be an ragged surface, as shown in FIG. 11.

Referring to FIG. 11, the oxidized parts of the storage node and the hemispherical grained silicon layer, which are respectively indicated as 130b and 131b in FIG. 11, are then removed, preferably with a wet etch using diluted hydrofluoric acid or buffered oxide etchant (BOE). A fifth dielectric film 134 and a second conductive layer 136 for a top electrode of the DRAM cell capacitor are then formed in the conventional manner. In this embodiment, a thin dielectric layer 134, such as stacked oxide-nitride-oxide (ONO) film, is formed on the exposed surface of the bottom electrode 130a and the surface of the second dielectric layer 124. As is known in the art of DRAM fabrication, the ONO film is reliable over silicon surfaces, and is typically used as a capacitor insulator. The ultra-thin bottom oxide layer of the stacked oxide-nitride-oxide (ONO) film 134 is formed by thermally oxidizing the polysilicon surface, then an LPCVD silicon nitride layer is deposited followed by oxidizing the silicon nitride layer to form the top oxide layer. Other material, such as NO, $Ta_2O_5$, $TiO_2$, PZT, or BST can be used as the thin dielectric layer 134. A second conductive layer 136 is then deposited over the stack oxide/silicon nitride/oxide layer 134 to serve as an upper plate of the DRAM cell capacitor, thereby forming a ragged polysilicon crown-shaped capacitor for a memory cell. Typically, the second conductive layer 136 is a doped polysilicon layer formed in the same manner as the polysilicon layer 130. Other material, such as metal or silicide, can be used as the conductive layer 136.

Although specific embodiments have been illustrated and described, it will be obvious to those skilled in the art that various modifications may be made without departing from the spirit which is intended to be limited solely by the appended claims.

What is claimed is:

1. A method for forming a capacitor, said method comprising the steps of:

forming a first dielectric layer on a semiconductor substrate;

removing a portion of said first dielectric layer to define a contact hole within said first dielectric layer, said contact hole being extended down to a source region in said substrate;

forming a conductive plug being communicated to said source region within said contact hole;

forming a second dielectric layer on said first dielectric layer and said conductive plug;

forming a third dielectric layer, having a thickness of about 5000 to about 10000 angstroms and being made of silicon oxide, on said second dielectric layer;

removing portions of said third dielectric layer and said second dielectric layer to define a storage node opening within said third dielectric layer and said second dielectric layer, said storage node opening being located over said conductive plug;

forming a first conductive layer having a thickness of about 500 to about 3000 angstroms, being made of doped polysilicon, and covering conformably the inside surface of said storage node opening and on said third dielectric layer;

forming a fourth dielectric layer being made of silicon oxide on said first conductive layer;

planarizing said substrate to the surface of said third dielectric layer;

removing said fourth dielectric layer and said third dielectric layer to leave a storage node composed of said first conductive layer;

depositing a hemispherical grained silicon layer having a thickness of about 200 to about 1000 angstroms on said storage node and said second dielectric layer;

performing a thermal oxidization process to said substrate to oxidize said hemispherical grained silicon layer and portions of said storage node exposed through grains of said hemispherical grained silicon layer;

performing a wet etch step to remove oxidized parts of said storage node and said hemispherical grained silicon layer;

forming a fifth dielectric layer on said storage node; and forming a second conductive layer on said fifth dielectric layer.

2. The method according to claim 1, wherein said first dielectric layer comprises silicon oxide.

3. The method according to claim 1, wherein said second dielectric layer comprises silicon nitride.

4. The method according to claim 1, wherein said fifth dielectric layer comprises a material selected from the group consisted of stacked oxide-nitride-oxide (ONO) film, NO, $Ta_2O_5$, $TiO_2$, PZT, and BST.

5. The method according to claim 1, wherein said conductive plug comprises polysilicon.

6. The method according to claim 1, wherein said thermal oxidization process is performed in an oxygen-containing ambient with a temperature between about 650 to 950° C. to oxidize said hemispherical grained silicon layer and portions of said storage node exposed through said grains of said hemispherical grained silicon layer.

7. The method according to claim 1, wherein said thermal oxidization process forms a ragged surface of silicon of said storage node.

8. A method for forming a capacitor, said method comprising the steps of:

forming a first dielectric layer on a semiconductor substrate;

removing a portion of said first dielectric layer to define a contact hole within said first dielectric layer, said contact hole being extended down to a source region in said substrate;

forming a conductive plug being communicated to said source region within said contact hole;

forming a second dielectric layer on said first dielectric layer and said conductive plug;

forming a third dielectric layer, having a thickness of about 5000 to about 10000 angstroms and being made of silicon oxide, on said second dielectric layer;

removing portions of said third dielectric layer and said second dielectric layer to define a storage node opening within said third dielectric layer and said second dielectric layer, said storage node opening being located over said conductive plug;

forming a first conductive layer having a thickness of about 500 to about 3000 angstroms, being made of doped polysilicon, and covering conformably the inside surface of said storage node opening and on said third dielectric layer;

forming a fourth dielectric layer being made of silicon oxide on said first conductive layer;

planarizing said substrate to the surface of said third dielectric layer;

removing said fourth dielectric layer and said third dielectric layer to leave a storage node composed of said first conductive layer;

depositing a hemispherical grained silicon layer having a thickness of about 200 to about 1000 angstroms on said storage node and said second dielectric layer;

performing a thermal oxidization process to said substrate to oxidize said hemispherical grained silicon layer and portions of said storage node exposed through grains of said hemispherical grained silicon layer, in order to form a ragged surface of silicon of said storage node;

performing a wet etch step to remove oxidized parts of said storage node and said hemispherical grained silicon layer;

forming a fifth dielectric layer on said storage node; and forming a second conductive layer on said fifth dielectric layer.

9. The method according to claim 8, wherein said first dielectric layer comprises silicon oxide.

10. The method according to claim 8, wherein said second dielectric layer comprises silicon nitride.

11. The method according to claim 8, wherein said hemispherical grained silicon layer has a thickness between about 200 to 1000 angstroms.

* * * * *